US012719445B2

(12) United States Patent
Gong et al.

(10) Patent No.: US 12,719,445 B2
(45) Date of Patent: Aug. 25, 2026

(54) ACOUSTIC RESONATOR IN TRANSVERSE EXCITATION SHEAR MODE

(71) Applicant: SPECTRON (SHENZHEN) TECHNOLOGIES CO., LTD, Shenzhen (CN)

(72) Inventors: Songbin Gong, Shenzhen (CN); Ruochen Lv, Shenzhen (CN)

(73) Assignee: SPECTRON (SHENZHEN) TECHNOLOGIES CO., LTD., Shenzhen (CN)

(*) Notice: Subject to any disclaimer, the term of this patent is extended or adjusted under 35 U.S.C. 154(b) by 957 days.

(21) Appl. No.: 17/998,242

(22) PCT Filed: Mar. 3, 2022

(86) PCT No.: PCT/CN2022/078932
§ 371 (c)(1),
(2) Date: Nov. 8, 2022

(87) PCT Pub. No.: WO2022/184118
PCT Pub. Date: Sep. 9, 2022

(65) Prior Publication Data

US 2023/0216479 A1 Jul. 6, 2023

(30) Foreign Application Priority Data

Mar. 4, 2021 (CN) ......................... 202110239484.5
Mar. 4, 2021 (CN) ......................... 202120467702.6

(51) Int. Cl.
*H03H 9/17* (2006.01)
*H03H 9/02* (2006.01)

(52) U.S. Cl.
CPC ........ *H03H 9/175* (2013.01); *H03H 9/02031* (2013.01); *H03H 9/02228* (2013.01); *H03H 9/176* (2013.01)

(58) Field of Classification Search
None
See application file for complete search history.

(56) References Cited

U.S. PATENT DOCUMENTS

2002/0036549 A1* 3/2002 Matsuda .............. H03H 9/6483 333/195
2012/0080979 A1 4/2012 Martin et al.
(Continued)

FOREIGN PATENT DOCUMENTS

CN 1894850 A 1/2007
CN 1933327 A 3/2007
(Continued)

OTHER PUBLICATIONS

Li, Q-I. et al., "Principle and Design of Surface Acoustic Wave Synchronous Resonator," Telecom Power Technology, 2020, vol. 37, No. 9, pp. 70-71 (with English abstract).
(Continued)

*Primary Examiner* — William J Klimowicz
(74) *Attorney, Agent, or Firm* — HSML.P.C.

(57) ABSTRACT

Provided is an acoustic resonator in a transverse excitation shear mode. The acoustic resonator comprises: an acoustic mirror (120), which comprises at least one first acoustic reflecting layer (121, 123, 125) and at least one second acoustic reflecting layer (122, 124), wherein the acoustic impedance of each first acoustic reflecting layer is less than that of each second acoustic reflecting layer; a piezoelectric layer (130), which is arranged on the acoustic mirror, and which comprises lithium niobate of a single crystal material and/or lithium tantalate of a single crystal material; electrode units (142, 143, 144), which are arranged on the piezoelectric layer (130) and are used for forming an electric field; and transverse reflectors (152, 154), which are arranged on the piezoelectric layer, are used for transversely reflecting (Continued)

acoustic waves, and can have a high electromechanical coupling coefficient and a high Q value at a frequency greater than 3 GHz.

14 Claims, 4 Drawing Sheets

(56) References Cited

U.S. PATENT DOCUMENTS

| | | | | |
|---|---|---|---|---|
| 2014/0152146 | A1* | 6/2014 | Kimura | H10N 30/8542 29/25.35 |
| 2017/0222618 | A1* | 8/2017 | Inoue | H03H 9/02787 |
| 2019/0165763 | A1* | 5/2019 | Mimura | H03H 9/02834 |
| 2019/0245510 | A1* | 8/2019 | Mimura | H10N 30/06 |
| 2019/0326881 | A1* | 10/2019 | Nurmela | H03H 9/17 |
| 2020/0228092 | A1* | 7/2020 | Nagatomo | H03H 9/589 |
| 2020/0358424 | A1 | 11/2020 | Kaneda et al. | |
| 2021/0167752 | A1* | 6/2021 | Caron | H03H 9/205 |
| 2021/0351762 | A1* | 11/2021 | Dyer | H03H 9/13 |
| 2023/0107820 | A1* | 4/2023 | Fukuhara | H03H 9/02228 310/365 |
| 2024/0120901 | A1* | 4/2024 | Gong | H03H 9/02015 |

FOREIGN PATENT DOCUMENTS

| | | | | |
|---|---|---|---|---|
| CN | 104205632 | B * | 3/2017 | H03H 9/564 |
| CN | 107070428 | A | 8/2017 | |
| CN | 108463720 | A | 8/2018 | |
| CN | 109842397 | A | 6/2019 | |
| CN | 110120794 | A | 8/2019 | |
| CN | 110572137 | A | 12/2019 | |
| CN | 112910433 | A | 6/2021 | |
| CN | 215072337 | U | 12/2021 | |
| WO | 2020092414 | A2 | 5/2020 | |

OTHER PUBLICATIONS

Munir, J. et al., "Effects of compensating the temperature coefficient of frequency with the acoustic reflector layers on the overall performance of solidly mounted resonators," Ultrasonics 74 (2017) pp. 153-160.

Office Action issued for Chinese Patent Application No. 202110239484.5, dated Oct. 23, 2024, 9 pages.

International Search Report issued for International Patent Application No. PCT/CN2022/078932, Date of mailing: May 11, 2022, 6 pages including English translation.

Written Opinion issued for International Patent Application No. PCT/CN2022/078932, Date of mailing: May 11, 2022, 7 pages including English machine translation.

* cited by examiner

ACOUSTIC RESONATOR IN TRANSVERSE EXCITATION SHEAR MODE

CROSS-REFERENCE TO RELATED APPLICATION

This application claims priority to and benefits of Chinese Invention Patent Application No. 202110239484.5, entitled "LATERALLY EXCITED SHEAR MODE ACOUSTIC RESONATOR", filed on Mar. 4, 2021, and Chinese Utility Model Patent Application No. 202120467702.6, entitled "LATERALLY EXCITED SHEAR MODE ACOUSTIC RESONATOR", filed on Mar. 4, 2021. The entireties of both applications are incorporated herein by reference.

TECHNICAL FIELD

The present disclosure relates to the technical field of resonators, more particularly, to a laterally excited shear mode acoustic resonator.

BACKGROUND

Radio frequency acoustic resonators' are small scale microfabricated structures used for synthesizing filtering functions or as frequency sources. Acoustic resonators have replaced other types of resonators used in mobile phones, small base stations, and internet of things (IoT) devices due to their smaller size and higher quality factor (Q). The acoustic resonators can achieve low loss (low power consumption), high suppression, a high signal-to-noise ratio, and more ultra-thin packages.

With the release of new communication standards (i.e., $5^{th}$ generation mobile networks), there is a need to extend an operating range of resonators to higher frequencies while maintaining a high electromechanical coupling coefficient and a high Q value while.

SUMMARY

Based on this, there is a need to provide a laterally excited shear mode acoustic resonator that has a high electromechanical coupling coefficient and a high Q value at frequencies above 3 GHz.

A laterally excited shear mode acoustic resonator includes: an acoustic mirror including at least one first acoustic reflection layer and at least one second acoustic reflection layer, acoustic impedance of each first acoustic reflection layer being less than that of each second acoustic reflection layer; a piezoelectric layer disposed on the acoustic mirror and including monocrystalline lithium niobate and/or monocrystalline lithium tantalate; an electrode unit disposed on the piezoelectric layer and configured to form an electric field; and a lateral reflector disposed on the piezoelectric layer and configured to laterally reflect a sound wave.

In an embodiment, the lateral reflector is insulated from the electrode unit, and the lateral reflector includes a first reflector located on a first side of the electrode unit and a second reflector located on a second side of the electrode unit, the first side and the second side being opposite sides.

In an embodiment, the electrode unit is configured to form an electric field mainly parallel to the piezoelectric layer and configured to generate a shear mode mechanical wave over an entire thickness of the piezoelectric layer.

In an embodiment, there are a plurality of first acoustic reflection layers and a plurality of second acoustic reflection layers; among the plurality of first acoustic reflection layers, the farther the first acoustic reflection layer is from the piezoelectric layer the greater is the thickness thereof; and among the plurality of the second acoustic reflection layers, the farther the second acoustic reflection layer is from the piezoelectric layer, the greater is the thickness thereof.

In an embodiment, the acoustic mirror includes three first acoustic reflection layers and two second acoustic reflection layers, there is a first acoustic reflection layer closer to the piezoelectric layer than all of the second acoustic reflection layers, and the first acoustic reflection layers and the second acoustic reflection layers in the acoustic mirror are arranged alternately.

In an embodiment, the acoustic impedance of each first acoustic reflection layer is less than that of each second acoustic reflection layer.

In an embodiment, the laterally excited shear mode acoustic resonator further includes a bearing wafer on which the acoustic mirror is disposed.

In an embodiment, a bonding auxiliary layer is further provided between the bearing wafer and the acoustic mirror, and is configured to facilitate bonding between the bearing wafer and the acoustic mirror.

In an embodiment, the first acoustic reflection layer farther away from the piezoelectric layer is thicker; and the second acoustic reflection layer farther away from the piezoelectric layer is thicker.

In an embodiment, the first acoustic reflection layer is made of at least one of silicon dioxide, aluminum, benzocyclobutene, polyimide, and spin on glass, and the second acoustic reflection layer is made of at least one of molybdenum, tungsten, titanium, platinum, aluminum nitride, tungsten oxide, and silicon nitride.

In an embodiment, the electrode unit includes a first common electrode, a second common electrode, a plurality of first interdigitated electrodes, and a plurality of second interdigitated electrodes, the first interdigitated electrodes are electrically connected to the first common electrode, the second interdigitated electrodes are electrically connected to the second common electrode, the first interdigitated electrodes are insulated from the second interdigitated electrodes, the first common electrode is configured to receive an input voltage, and the second common electrode is configured to be grounded.

In an embodiment, a direction of connection between the lateral reflectors on two sides of the electrode unit is a propagation direction of the sound wave; each of the first acoustic reflection layers and each of the second acoustic reflection layers of the acoustic mirror are aligned on two side edges of a first direction, the first direction is perpendicular to the direction of connection on a plane, and the plane is perpendicular to a height direction of the resonator; a first end of each of the first interdigitated electrodes is connected to the first common electrode, a first end of each of the second interdigitated electrodes is connected to the second common electrode, an orthographic projection of the first end of each of the first interdigitated electrodes on the acoustic mirror is aligned with a first side edge of the acoustic mirror in the first direction, and an orthographic projection of each of the first ends of the second interdigitated electrodes on the acoustic mirror is aligned with a second side edge of the acoustic mirror in the first direction.

In an embodiment, the first reflector and the second reflector both include at least one electrode strip, a distance between a center of the electrode strip closest to the electrode unit in the first reflector and a center of the interdigitated electrode on a first side edge of the electrode unit is ⅛ to 2 wavelengths of the sound wave, and a distance between a center of the electrode strip closest to the electrode unit in the second reflector and a center of the interdigitated electrode on a second side edge of the electrode unit is ⅛ to 2 wavelengths of the sound wave.

In an embodiment, the electrode strips are disposed in parallel to the first interdigitated electrodes and the second interdigitated electrodes.

In an embodiment, an orthographic projection of the acoustic mirror on the bearing wafer is located in the bearing wafer, a filling layer is disposed around the acoustic mirror, and the filling layer is disposed on the bearing wafer and is made of the same material as the first acoustic reflection layer.

In an embodiment, the laterally excited shear mode acoustic resonator further includes a first metal part disposed on the first common electrode and a second metal part disposed on the second common electrode, thicknesses of the first metal part and the second metal part are both greater than that of the electrode unit, and the first metal part and the second metal part are used for carrying out acoustic reflection in a first direction perpendicular to a propagation direction of the sound wave.

In an embodiment, the electrode unit is made of the same material as the lateral reflector and the material is metal and/or an alloy.

In an embodiment, the laterally excited shear mode acoustic resonator further includes a passivation layer disposed on the piezoelectric layer and covering the first interdigitated electrodes and the second interdigitated electrodes.

According to the above laterally excited shear mode acoustic resonator, the electric field is generated by the electrode unit and the sound wave is laterally reflected by the lateral reflector, so that the laterally excited shear mode acoustic resonator can be excited into a lateral shear vibration mode. Since the piezoelectric layer is made of monocrystalline lithium niobate or lithium tantalate, the laterally excited shear mode acoustic resonator may have a high electromechanical coupling coefficient and a high Q value at frequencies above 3 GHz.

BRIEF DESCRIPTION OF THE DRAWINGS

To describe the technical solutions in the embodiments of the present disclosure or in the traditional technology more clearly, the following briefly introduces the accompanying drawings required for describing the embodiments or the traditional technology. Apparently, the accompanying drawings in the following description show merely some embodiments of the present disclosure, and those of ordinary skill in the art may still derive other drawings from these accompanying drawings without creative efforts.

DETAILED DESCRIPTION OF THE EMBODIMENTS

Figure 1:
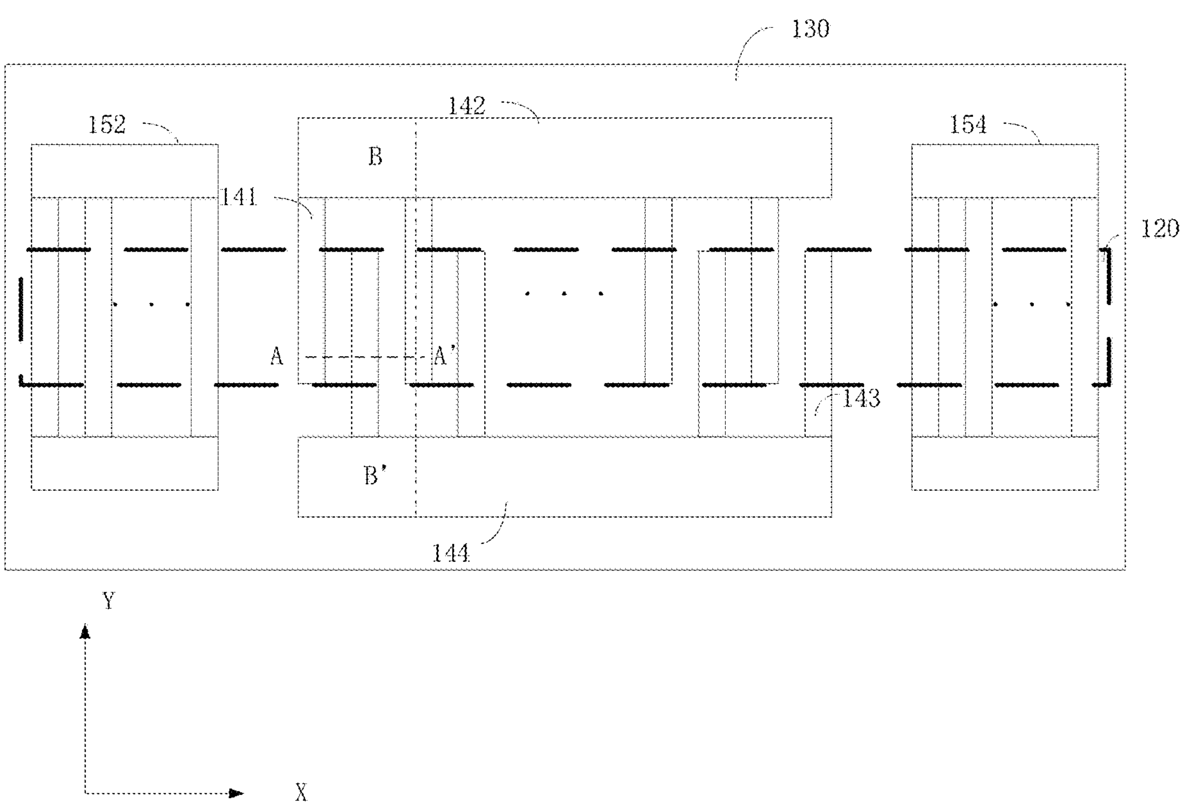
FIG. 1 is a top view of a partial structure of a laterally excited shear mode acoustic resonator according to an embodiment.

To facilitate understanding of the present disclosure, a more comprehensive description of the present disclosure will be given below with reference to the relevant drawings. Embodiments of the present disclosure are given in the drawings. However, the present disclosure may be implemented in many different forms but is not limited to the embodiments described herein. Rather, these embodiments are provided to make the contents disclosed in the present disclosure more fully understood.

Unless defined otherwise, all technical and scientific terms used herein have the same meanings as are commonly understood by those skilled in the art. The terms used herein in the specification of the present disclosure are for the purpose of describing specific embodiments only, but not intended to limit the present disclosure.

It should be understood that when an element or layer is referred to as being "on", "adjacent to", "connected to", or "coupled to" another element or layer, the element or layer may be directly on, adjacent to, connected to, or coupled to the another element or layer, or an intervening element or layer may be disposed therebetween. On the contrary, when an element is referred to as being "directly on", "directly adjacent to", "directly connected to", or "directly coupled to" another element or layer, no intervening element or layer may be disposed therebetween. It should be understood that although terms such as first, second, and third may be used to describe various elements, components, regions, layers, doping types and/or portions, the elements, components, regions, layers, doping types and/or portions may not be limited to such terms. Such terms are used only to distinguish one element, component, region, layer, doping type, or portion from another element, component, region, layer, doping type, or portion. Thus, without departing from the teaching of the present disclosure, a first element, component, region, layer, doping type, or portion may be referred to as a second element, component, region, layer, doping type, or portion. For example, a first doping type may be referred to as a second doping type, and similarly, the second doping type may be referred to as the first doping type. The first doping type and the second doping type are different doping types. For example, the first doping type may be P-type and the second doping type may be N-type, or the first doping type may be N-type and the second doping type may be P-type.

Spatial relationship terms such as "under", "underneath", "below", "beneath", "over", and "above" may be used for illustrative purposes to describe a relationship between one element or feature and another element or feature illustrated in the figures. It should be understood that, in addition to the orientations illustrated in the figures, the spatial relationship terms are intended to further include different orientations of the device in use and operation. For example, if the device in the figures is flipped, the element or feature described as "below", "underneath" or "under" another element or feature may be oriented as "on" the another element or feature. Thus, the exemplary terms "below" and "under" may include two orientations of above and below. In addition, the device may include additional orientations (e.g., 90-degree rotation or other orientations), and thus spatial descriptors used herein may be interpreted accordingly.

In use, the singular forms of "a", "one", and "the" may also include plural forms, unless otherwise clearly specified by the context. It should be further understood that the terms "include/comprise" and/or "have" specify the presence of the features, integers, steps, operations, components, portions, or their combinations, but may not exclude the presence or addition of one or more of other features, integers, steps, operations, components, portions, or their combinations. At the same time, in the specification, the term "and/or" may include any and all combinations of related listed items.

Various embodiments of the present disclosure are described herein with reference to cross-sectional views of schematic diagrams of ideal embodiments (and intermediate structures) of the present disclosure. Correspondingly, illustrated shape variations caused by, for example, manufacturing techniques and/or tolerances, may be expected. Thus, the embodiments of the present disclosure may not be limited to the specific shapes of the regions illustrated herein, but may include shape deviations caused by, for example, the manufacturing techniques. For example, an implanted region illustrated as a rectangle, typically, has rounded or curved features and/or a gradient of implant concentration at its edges rather than a binary change from an implanted region to a non-implanted region. Likewise, a buried region formed by implantation may result in some implantation in the region between the buried region and a surface through which the implantation takes place. Thus, the region shown in the figure is generally schematic, and the illustrated shape is not intended to show the actual shape of the region of the device, and is not intended to limit the scope of the present disclosure.

Bulk acoustic wave (BAW) and surface acoustic wave (SAW) resonators are most commonly used devices for synthesizing filters and oscillators between 0.6 GHz and 3 GHz. These acoustic devices are commercially successful and are widely used in mobile phone front-end modules or as discrete elements for radio front-ends. Existing BAW and SAW devices can exhibit Q values in excess of 1000 and electromechanical coupling coefficients of approximately 7%-10% at frequencies below 3 GHz. However, extension of its frequency operating range to be above 3 GHz may be subject to several technical uncertainties and fundamental limitations. A new 5G standard requires an electromechanical coupling factor to be more than 10%. This requirement cannot be achieved by BAW and SAW devices without changing constitutive materials or operation modes. Similarly, material losses pose a fundamental limit on an achievable maximum Q value of existing BAW and SAW devices above 3 GHz.

Based on the above, new devices with high electromechanical coupling coefficient and a high-quality value at frequencies above 3 GHz are required on the market.

The present disclosure is intended to develop a new mechanical/acoustic wafer-level resonator and to provide a method for fabricating the same. The resonator can have a high Q value and a high electromechanical coupling coefficient at frequencies above 3 GHz. The resonator supports the synthesis of high-performance passband filters, thereby meeting new requirements of the 5G communication standard and future updates.

Figure 2:
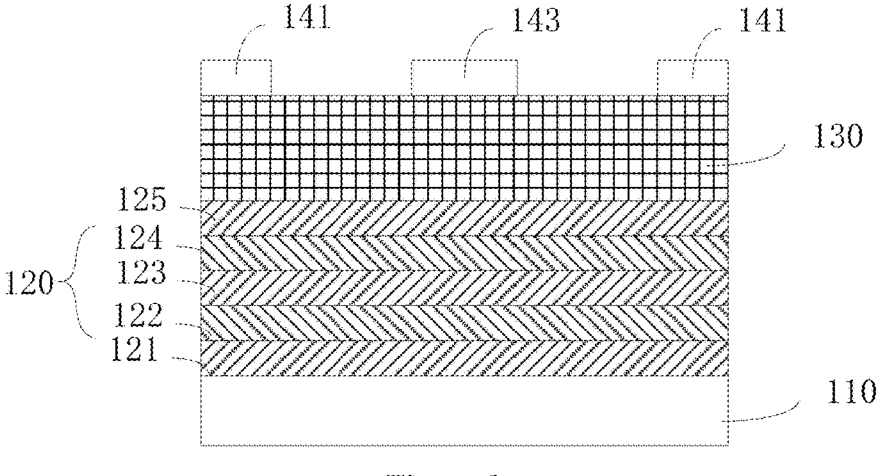
FIG. 2 is a cross-sectional view taken along a line A-A' in FIG. 1.

FIG. 1 is a top view of a partial structure of a laterally excited shear mode acoustic resonator according to an embodiment; FIG. 2 is a cross-sectional view taken along a line A-A' in FIG. 1. Referring to FIG. 1 and FIG. 2, the laterally excited shear mode acoustic resonator includes an acoustic mirror 120, a piezoelectric layer 130, an electrode unit, and a lateral reflector. FIG. 1 is intended mainly to illustrate shapes of the electrode unit and the lateral reflector in corresponding embodiments, so other structures on the piezoelectric layer 130 are omitted.

The electrode unit is disposed on the piezoelectric layer 130 and configured to form an electric field. The electrode unit may include interdigitated electrodes. In the embodiment shown in FIG. 1 and FIG. 2, the electrode unit includes a set of first interdigitated electrodes 141 and a set of second interdigitated electrodes 143. The first interdigitated electrodes 141 and the second interdigitated electrodes 143 extend toward a first direction (the Y direction in FIG. 1), and thus are parallel to each other. The first interdigitated electrodes 141 are insulated from the second interdigitated electrodes 143. The first interdigitated electrodes 141 are configured to receive an input voltage, and the second interdigitated electrodes 143 are configured to be grounded. The electrode unit further includes a first common electrode 142 and a second common electrode 144. One end of each of the first interdigitated electrodes 141 is connected to the first common electrode 142, and one end of each of the second interdigitated electrodes 143 is connected to the second common electrode 144. The common electrode is also referred to as a busbar.

The lateral reflector is also disposed on the piezoelectric layer 130, may be arranged in the same layer as the electrode unit, and includes a first reflector 152 on a first side (the left side in FIG. 1) of the electrode unit and a second reflector on a second side (the right side in FIG. 1) of the electrode unit. The lateral reflector is insulated from the electrode unit, and is configured to laterally reflect the sound wave.

The piezoelectric layer 130 is disposed on the acoustic mirror 120. The piezoelectric layer 130 includes monocrystalline lithium niobate and/or monocrystalline lithium tantalate.

The acoustic mirror 120 includes at least one first acoustic reflection layer and at least one second acoustic reflection layer. Acoustic impedance of each first acoustic reflection layer is less than that of each second acoustic reflection layer. In an embodiment of the present disclosure, one layer closest to the piezoelectric layer 130 in the acoustic mirror 120 should be a first acoustic reflection layer, that is, there is a first acoustic reflection layer closer to the piezoelectric layer 130 than all of the second acoustic reflection layers. In the embodiment shown in FIG. 2, the acoustic mirror 120 includes three first acoustic reflection layers (i.e., a first acoustic reflection layer 121, a first acoustic reflection layer 123, and a first acoustic reflection layer 125) and two second acoustic reflection layers (i.e., a second acoustic reflection layer 122 and a second acoustic reflection layer 124). The first acoustic reflection layers and the second acoustic reflection layers are arranged alternately.

According to the laterally excited shear mode acoustic resonator, the electric field is generated by the electrode unit and the sound wave is laterally reflected by the lateral reflector, so that the laterally excited shear mode acoustic resonator can be excited into a lateral shear vibration mode. Further, since the piezoelectric layer 130 is made of monocrystalline lithium niobate or lithium tantalate, the laterally excited shear mode acoustic resonator may have a high electromechanical coupling coefficient and a high Q value at frequencies above 3 GHz.

Figure 3:
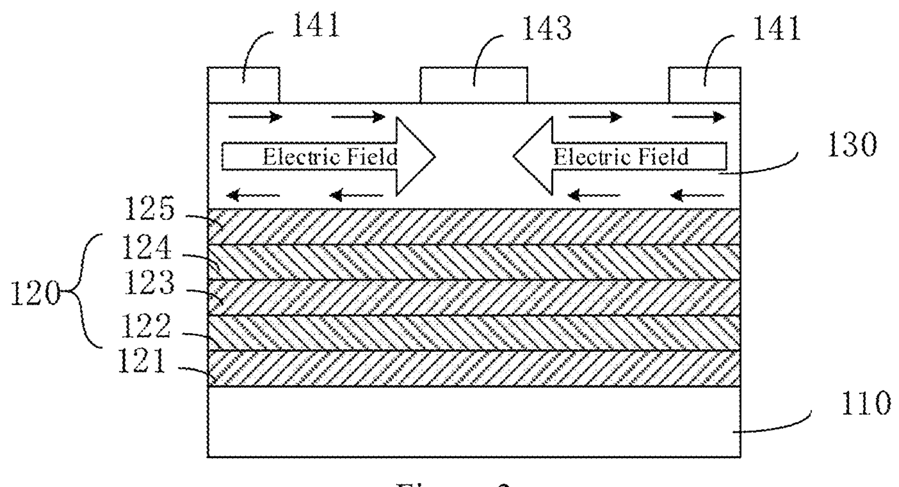
FIG. 3 is a schematic diagram of a direction of an electric field and a propagation direction of a mechanical wave in a piezoelectric layer.

Referring to FIG. 3, the larger arrow in the figure indicates a direction of an electric field, while the smaller arrow indicates a propagation direction of a mechanical wave in a shear vibration mode. The electric field is mainly parallel to the piezoelectric layer 130 and is configured to generate a mechanical wave in a shear mode over an entire thickness of the piezoelectric layer 130. The monocrystalline lithium niobate/lithium tantalate combined with the structure of the electrode unit and the structure of the lateral reflector of the present disclosure can obtain an optimal shear vibration mode. This shear vibration mode has a greater acoustic wave velocity and can achieve a higher frequency than conventional commercial filters without changing key dimensions (such as a step pitch of the interdigitated electrodes) of the device.

In an embodiment of the present disclosure, the electrode unit is made of the same material as the lateral reflector and the material is metal and/or an alloy. In an embodiment of the present disclosure, the electrode unit may be made of aluminum (Al), copper (Cu), aluminum copper (AlCu), aluminum silicon copper (AlSiCu), molybdenum (Mo), tungsten (W), silver (Ag), or any other conductive metal.

In the embodiment shown in FIG. 2, the laterally excited shear mode acoustic resonator further includes a bearing wafer 110. The acoustic mirror 120 is disposed on the bearing wafer 110.

In an embodiment of the present disclosure, a bonding auxiliary layer is further disposed between the bearing wafer 110 and the acoustic mirror 120 and is configured to facilitate the bonding between the bearing wafer 110 and the acoustic mirror 120. In an embodiment of the present disclosure, the bonding auxiliary layer may be a thin silicon dioxide layer.

In an embodiment of the present disclosure, the first acoustic reflection layers are made of a low-acoustic-impedance material, and the second acoustic reflection layers are made of a high-acoustic-impedance material. It should be understood that the low-acoustic-impedance material has lower acoustic impedance than the high-acoustic-impedance material. The low-acoustic-impedance material may be at least one of silicon dioxide, aluminum, Benzocyclobutene (BCB), polyimide, and spin on glass. The high-acoustic-impedance material may be at least one of molybdenum, tungsten, titanium, platinum, aluminum nitride, alumina, tungsten oxide, and silicon nitride. It may be understood that, in other embodiments, the low-acoustic-impedance material and the high-acoustic-impedance material may also use combinations of other materials with relatively large impedance ratios.

Figure 4:
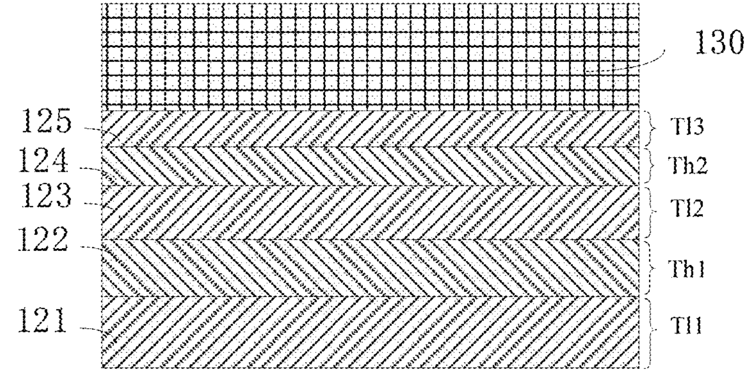
FIG. 4 is a schematic diagram of thicknesses of reflection layers of a reflection mirror according to an embodiment.

The first acoustic reflection layers and the second acoustic reflection layers of the acoustic mirror 120 may have equal or unequal thicknesses. In an embodiment of the present disclosure, there are a plurality of first acoustic reflection layers and a plurality of second acoustic reflection layers. Among the plurality of first acoustic reflection layers, the further the first acoustic reflection layer is from the piezoelectric layer 130, the greater is the thickness thereof; and among the plurality of the second acoustic reflection layers, the farther the second acoustic reflection layer is from the piezoelectric layer 130, the greater is the thickness thereof. This design can obtain a greater Q value. Referring to FIG. 4, in the embodiment shown in FIG. 4, a thickness T11 of the first acoustic reflection layer 121≥a thickness T12 of the first acoustic reflection layer 123≥a thickness T13 of the first acoustic reflection layer 125, and a thickness Th1 of the second acoustic reflection layer 122≥a thickness Th2 of the second acoustic reflection layer 124. It may be understood that, in other embodiments, a thickness relationship between the first acoustic reflection layers and the second acoustic reflection layers may also be set according to other laws, such as T11=T12=T13 and Th1=Th2; or T11>T12>T13 and Th1>Th2; or T11<T12, T13<T12, and Th1<Th2.

FIG. 1 also shows a position of the acoustic mirror 120 in an overhead view. The X direction in FIG. 1 is the propagation direction of the sound wave. Each of the first acoustic reflection layers and each of the second acoustic reflection layers of the acoustic mirror 120 are aligned on two side edges in the Y direction. An orthographic projection of an edge of one end of each of the first interdigitated electrodes 141 away from the first common electrode 142 on the acoustic mirror 120 is aligned with a first side edge of the acoustic mirror 120 in the Y direction, and an orthographic projection of an edge of one end of each of the second interdigitated electrodes 143 away from the first common electrode 142 on the acoustic mirror 120 is aligned with a second side edge of the acoustic mirror 120 in the Y direction.

Figure 5:
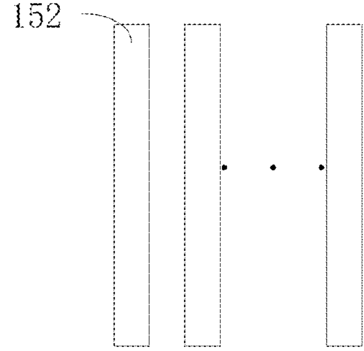
FIG. 5 is a schematic structural diagram of a first reflector according to an embodiment.

As shown in FIG. 5, electrode strips of the lateral reflector may be separated from each other, or may be connected to each other through a lateral structure shown in FIG. 1. The electrode strips of the lateral reflector may be disposed in parallel to the interdigitated electrodes of the electrode unit.

Figure 6:
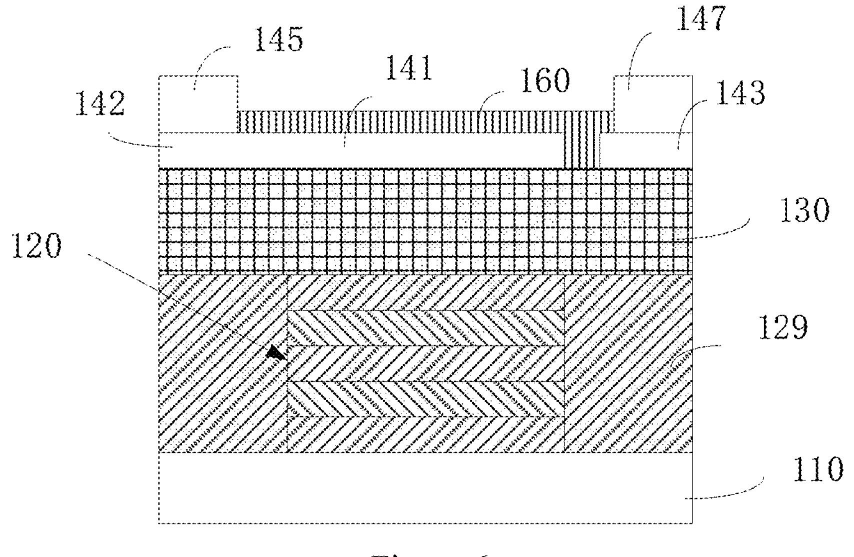
FIG. 6 is a cross-sectional view taken along a line B-B' in FIG. 1.

FIG. 6 is a cross-sectional view taken along a line B-B' in FIG. 1. In this embodiment, an area of the acoustic mirror 120 is smaller than that of the piezoelectric layer 130 and the bearing wafer 110, and thus a filling layer 129 is further disposed around the acoustic mirror 120. That is, an orthographic projection of the acoustic mirror 120 on the bearing wafer 110 is located in the bearing wafer, and the filling layer 129 is disposed around the acoustic mirror 120 and is disposed on the bearing wafer 110. In an embodiment of the present disclosure, the filling layer may be made of one or more of silicon dioxide, molybdenum, tungsten, tungsten oxide, or silicon nitride. In an embodiment of the present disclosure, the filling layer is made of the same material as the first acoustic reflection layers, to improve the quality factor of the acoustic resonator.

In the embodiment shown in FIG. 6, the laterally excited shear mode acoustic resonator further includes a first metal part 145 disposed on the first common electrode 141 and a second metal part 147 disposed on the second common electrode 143. Thicknesses of the first metal part 145 and the second metal part 147 are both greater than that of the electrode unit. The first metal part 145 and the second metal part 147 are configured to carry out acoustic reflection in the Y direction in FIG. 1.

Figure 8:
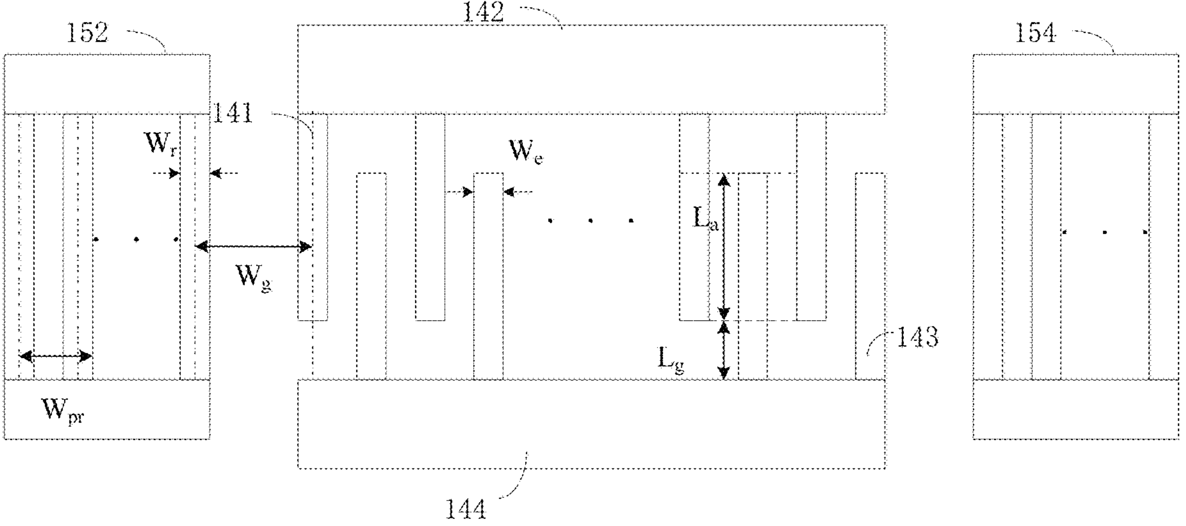
FIG. 8 shows labeling of sizes of main structures of an electrode unit and a lateral reflector according to an embodiment.

In an embodiment of the present disclosure, a distance $W_g$ (see FIG. 8) between a center of the electrode strip closest to the electrode unit in the first reflector 152 and a center of the interdigitated electrode on a first side edge of the electrode unit is ⅛ to 2 wavelengths of the sound wave, and a distance between a center of the electrode strip closest to the electrode unit in the second reflector 154 and a center of the interdigitated electrode on a second side edge of the electrode unit is ⅛ to 2 wavelengths of the sound wave.

A vibration frequency of the mechanical wave in the shear vibration mode formed in the piezoelectric layer 130 is related to a thickness of each film and a distance between adjacent interdigitated electrodes (also referred to as a step pitch of interdigitated electrodes) in the electrode unit. The stress is mainly confined to a region between the first interdigitated electrode 141 and the second interdigitated electrode 143 and not covered by metal. Important film thicknesses/distances of the resonator are labeled in FIG. 7 and FIG. 8.

Figure 7:
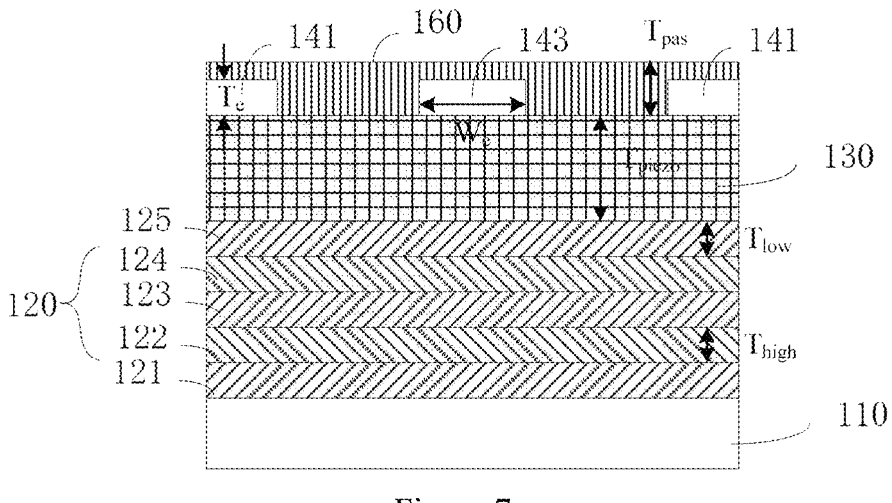
FIG. 7 shows labeling of thicknesses of films of a laterally excited shear mode acoustic resonator according to an embodiment.

In the embodiment shown in FIG. 7, the laterally excited shear mode acoustic resonator further includes a passivation layer 160. The passivation layer 160 is disposed on the piezoelectric layer 130 and covers the first interdigitated electrodes 141 and the second interdigitated electrodes 143. The passivation layer 160 can reduce a frequency temperature coefficient of the resonator and passivate a metal electrode.

Figure 9:
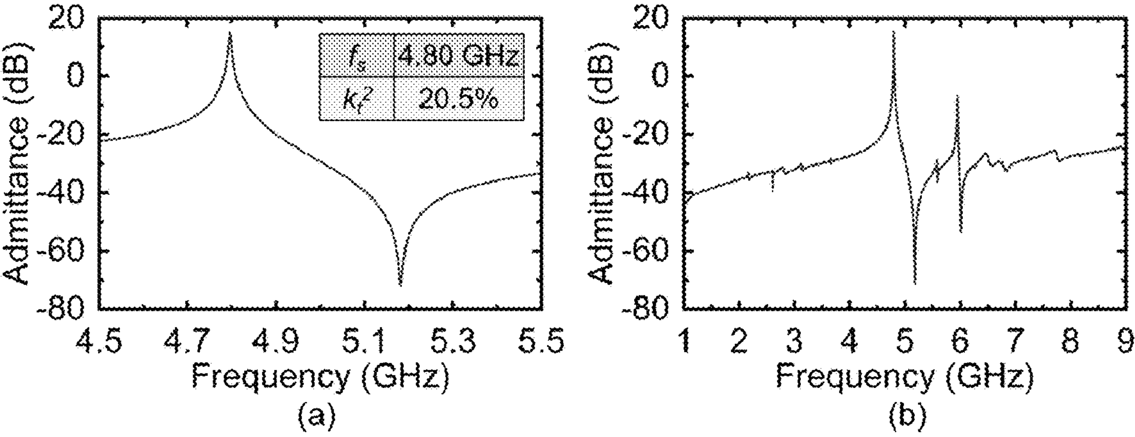
FIG. 9 shows simulation results of characteristic admittance of a laterally excited shear mode acoustic resonator according to an embodiment.

FIG. 9 shows simulation results of characteristic admittance of a laterally excited shear mode acoustic resonator according to an embodiment. Plot (b) is a partial curve of plot (a), and kt denotes the electromechanical coupling coefficient. Characteristic frequency simulation is used for obtaining an optimized stack reflector thickness for a resonant frequency of 4.8 GHz. The same characteristic frequency analysis is used for determining an optimal in-plane reflector layer position and a relative position of a reflector stack relative to the interdigitated electrodes.

In the description of the specification, reference terms such as "some embodiments", "other embodiments", and "ideal examples" mean that a particular feature, structure, material, or characteristic described in connection with the embodiment or example is included in at least one embodiment or example of the present disclosure. In the specification, the schematic expressions to the above terms are not necessarily referring to the same embodiment or example.

Technical features of the above embodiments may be combined randomly. To make descriptions brief, not all possible combinations of the technical features in the embodiments are described. Therefore, as long as there is no contradiction between the combinations of the technical features, they should all be considered as scopes disclosed in the specification.

The above embodiments only describe several implementations of the present disclosure, and their description is specific and detailed, but cannot therefore be understood as a limitation on the patent scope of the present disclosure. It should be noted that those of ordinary skill in the art may further make variations and improvements without departing from the conception of the present disclosure, and these all fall within the protection scope of the present disclosure. Therefore, the patent protection scope of the present disclosure should be subject to the appended claims.

What is claimed is:

1. A laterally excited shear mode acoustic resonator, comprising:

an acoustic mirror comprising at least one first acoustic reflection layer and at least one second acoustic reflection layer, acoustic impedance of each first acoustic reflection layer being less than that of each second acoustic reflection layer;

a piezoelectric layer disposed on the acoustic mirror and comprising monocrystalline lithium niobate and/or monocrystalline lithium tantalate;

an electrode unit disposed on the piezoelectric layer and configured to form an electric field; and lateral reflectors disposed on the piezoelectric layer and configured to laterally reflect a sound wave; wherein electrode unit comprises:

a first common electrode, a second common electrode, a plurality of first interdigitated electrodes, and a plurality of second interdigitated electrodes, the first interdigitated electrodes are electrically connected to the first common electrode, the second interdigitated electrodes are electrically connected to the second common electrode, the first interdigitated electrodes are insulated from the second interdigitated electrodes, the first common electrode is configured to receive an input voltage, and the second common electrode is configured to be grounded; and a direction of connection between the lateral reflectors on two sides of the electrode unit is a propagation direction of the sound wave;

each of the first acoustic reflection layers and each of the second acoustic reflection layers of the acoustic mirror are aligned on two side edges of a first direction, the first direction is perpendicular to the direction of connection on a plane, and the plane is perpendicular to a height direction of the resonator;

a first end of each of the first interdigitated electrodes is connected to the first common electrode, a first end of each of the second interdigitated electrodes is connected to the second common electrode, an orthographic projection of the first end of each of the first interdigitated electrodes on the acoustic mirror is aligned with a first side edge of the acoustic mirror in the first direction, and an orthographic projection of the first end of each of the second interdigitated electrodes on the acoustic mirror is aligned with a second side edge of the acoustic mirror in the first direction.

2. The laterally excited shear mode acoustic resonator according to claim 1, wherein the lateral reflectors are insulated from the electrode unit, and the lateral reflectors comprise a first reflector located on a first side of the electrode unit and a second reflector located on a second side of the electrode unit, the first side and the second side being opposite sides.

3. The laterally excited shear mode acoustic resonator according to claim 2, wherein the first reflector and the second reflector both comprise:

at least one electrode strip, a distance between a center of the electrode strip closest to the electrode unit in the first reflector and a center of the interdigitated electrode on a first side edge of the electrode unit is ⅛ to 2 wavelengths of the sound wave, and a distance between a center of the electrode strip closest to the electrode unit in the second reflector and a center of the interdigitated electrode on a second side edge of the electrode unit is ⅛ to 2 wavelengths of the sound wave.

4. The laterally excited shear mode acoustic resonator according to claim 3, wherein the electrode strips are disposed in parallel to the first interdigitated electrodes and the second interdigitated electrodes.

5. The laterally excited shear mode acoustic resonator according to claim 1, wherein the electrode unit is configured to form an electric field substantially parallel to the piezoelectric layer and configured to generate a shear mode mechanical wave over an entire thickness of the piezoelectric layer.

6. The laterally excited shear mode acoustic resonator according to claim 1, wherein there are a plurality of first acoustic reflection layers and a plurality of second acoustic reflection layers;

among the plurality of first acoustic reflection layers, the farther the first acoustic reflection layer is from the piezoelectric layer, the greater its thickness; and among the plurality of the second acoustic reflection layers, the farther the second acoustic reflection layer is from the piezoelectric layer, the greater its thickness.

7. The laterally excited shear mode acoustic resonator according to claim 6, further comprising a bearing wafer on which the acoustic mirror is disposed.

8. The laterally excited shear mode acoustic resonator according to claim 7, wherein a bonding auxiliary layer is further provided between the bearing wafer and the acoustic mirror, and is configured to facilitate bonding between the bearing wafer and the acoustic mirror.

9. The laterally excited shear mode acoustic resonator according to claim 7, wherein an orthographic projection of the acoustic mirror on the bearing wafer is located in the bearing wafer, a filling layer is disposed around the acoustic mirror, and the filling layer is disposed on the bearing wafer and is made of the same material as the first acoustic reflection layer.

10. The laterally excited shear mode acoustic resonator according to claim 1, wherein the acoustic mirror comprises three first acoustic reflection layers and two second acoustic reflection layers, there is a first acoustic reflection layer closer to the piezoelectric layer than all of the second acoustic reflection layers, and the first acoustic reflection layers and the second acoustic reflection layers in the acoustic mirror are arranged alternately.

11. The laterally excited shear mode acoustic resonator according to claim 1, wherein the first acoustic reflection layer is made of at least one of silicon dioxide, aluminum, benzocyclobutene, polyimide, and spin on glass, and the second acoustic reflection layer is made of at least one of molybdenum, tungsten, titanium, platinum, aluminum nitride, tungsten oxide, and silicon nitride.

12. The laterally excited shear mode acoustic resonator according to claim 1, further comprising:

a first metal part disposed on the first common electrode, and a second metal part disposed on the second common electrode, thicknesses of the first metal part and the second metal part are both greater than that of the electrode unit, and the first metal part and the second metal part are used for carrying out acoustic reflection in a first direction perpendicular to the propagation direction of the sound wave.

13. The laterally excited shear mode acoustic resonator according to claim 1, wherein the electrode unit is made of the same material as the lateral reflectors and the material is metal and/or an alloy.

14. The laterally excited shear mode acoustic resonator according to claim 1, further comprising a passivation layer disposed on the piezoelectric layer and covering the first interdigitated electrodes and the second interdigitated electrodes.

* * * * *